US012713531B2

United States Patent
(12) United States Patent
Lee et al.

(10) Patent No.: US 12,713,531 B2
(45) Date of Patent: Aug. 18, 2026

(54) PRINTED CIRCUIT BOARD

(71) Applicant: SAMSUNG ELECTRO-MECHANICS CO., LTD., Suwon-si (KR)

(72) Inventors: Jin Uk Lee, Suwon-si (KR); Tae Kyung Lee, Suwon-si (KR); Kee Ju Um, Suwon-si (KR); Min Gyu Park, Suwon-si (KR); Young Hun You, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 212 days.

(21) Appl. No.: 18/657,425

(22) Filed: May 7, 2024

(65) Prior Publication Data

US 2025/0024601 A1 Jan. 16, 2025

(30) Foreign Application Priority Data

Jul. 14, 2023 (KR) ........................ 10-2023-0091781

(51) Int. Cl.
*H05K 1/11* (2006.01)
*H05K 1/181* (2026.01)

(52) U.S. Cl.
CPC ............. *H05K 1/113* (2013.01); *H05K 1/181* (2013.01); *H05K 2201/0137* (2013.01); *H05K 2201/0195* (2013.01)

(58) Field of Classification Search
CPC .................. H05K 1/113; H05K 1/181; H05K 2201/0137; H05K 2201/0195
USPC ......................................................... 174/261
See application file for complete search history.

(56) References Cited

U.S. PATENT DOCUMENTS

| | | | | |
|---|---|---|---|---|
| 6,452,250 | B1 | 9/2002 | Buynoski | |
| 10,804,204 | B2 | 10/2020 | Rubin et al. | |
| 2002/0046880 | A1* | 4/2002 | Takubo | H05K 3/462 257/E23.063 |
| 2010/0187655 | A1* | 7/2010 | Choi | H10B 12/033 257/532 |
| 2020/0035604 | A1* | 1/2020 | Rubin | H10W 70/65 |
| 2020/0365477 | A1 | 11/2020 | Moitzi et al. | |
| 2021/0242896 | A1* | 8/2021 | Kim | H01Q 1/2283 |

OTHER PUBLICATIONS

Japanese Office Action dated May 13, 2025 issued in Japanese Patent ApplicationNo. 2024-081030 (with English translation).

* cited by examiner

*Primary Examiner* — Andargie M Aychillhum
(74) *Attorney, Agent, or Firm* — Morgan, Lewis & Bockius LLP

(57) ABSTRACT

A printed circuit board includes a substrate portion including a first insulating layer, and a first wiring layer disposed on or in the first insulating layer, and a connection structure disposed on or in the substrate portion, the connection structure including a plurality of first dielectric layers, first and second metal layers respectively disposed on the plurality of first dielectric layers, a second insulating layer disposed on the plurality of first dielectric layers, and a second wiring layer disposed on the second insulating layer. Each of the plurality of first dielectric layers includes an organic material. A distance between the first metal layer and the second metal layer is less than a distance between the first metal layer and the second wiring layer.

19 Claims, 10 Drawing Sheets

PRINTED CIRCUIT BOARD

CROSS-REFERENCE TO RELATED APPLICATION(S)

This application claims benefit of priority to Korean Patent Application No. 10-2023-0091781 filed on Jul. 14, 2023 in the Korean Intellectual Property Office, the disclosure of which is incorporated herein by reference in its entirety.

TECHNICAL FIELD

The present disclosure relates to a printed circuit board.

Multichip packages including a memory chip such as a high bandwidth memory (HBM) and a processor chip such as a central processing unit (CPU), a graphics processing unit (GPU), an application specific integrated circuit (ASIC), or a field programmable gate array (FPGA) have been used to process data, which has been exponentially increasing due to recent developments in artificial intelligence (AI) technology. In particular, as the number of CPU and GPU cores of server products rapidly increases, die-split technology capable of effectively increasing the number of cores has become common, and thus die-to-die interconnection has been required. Research has been conducted to design a board to include a connection structure performing die-to-die interconnection, thereby achieving a simplified board and package structure, improving reliability of the connection structure, and increasing yield.

SUMMARY

An aspect of the present disclosure provides a printed circuit board on which an electronic component and a semiconductor chip are mounted, the printed circuit board capable of performing die-to-die interconnection.

Another aspect of the present disclosure provides a printed circuit board including a connection structure capable of implementing a device function in addition to die-to-die interconnection.

Another aspect of the present disclosure provides a printed circuit board having improved reliability.

According to an aspect of the present disclosure, there is provided a printed circuit board including a substrate portion including a first insulating layer, and a first wiring layer disposed on or in the first insulating layer, and a connection structure disposed on or in the substrate portion, the connection structure including a plurality of first dielectric layers, first and second metal layers respectively disposed on the plurality of first dielectric layers, a second insulating layer disposed on the plurality of first dielectric layers, and a second wiring layer disposed on the second insulating layer. Each of the plurality of first dielectric layers may include an organic material. A distance between the first metal layer and the second metal layer may be less than a distance between the first metal layer and the second wiring layer.

According to another aspect of the present disclosure, there is provided a printed circuit board including a substrate portion including a first insulating layer, and a first wiring layer disposed on or in the first insulating layer, and a connection structure disposed on or in the substrate portion, the connection structure including a capacitor portion including a dielectric layer and a first metal layer disposed on or in the dielectric layer, and a wiring portion including a second insulating layer and a second wiring layer disposed on the second insulating layer. The first metal layer may include a pair of metal plates, opposing each other. The dielectric layer may include an organic material.

According to example embodiments of the present disclosure, a printed circuit board on which an electronic component and a semiconductor chip are mounted may perform die-to-die interconnection.

According to example embodiments of the present disclosure, a printed circuit board including a connection structure may implement a device function in addition to die-to-die interconnection.

According to example embodiments of the present disclosure, a printed circuit board may have improved reliability.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
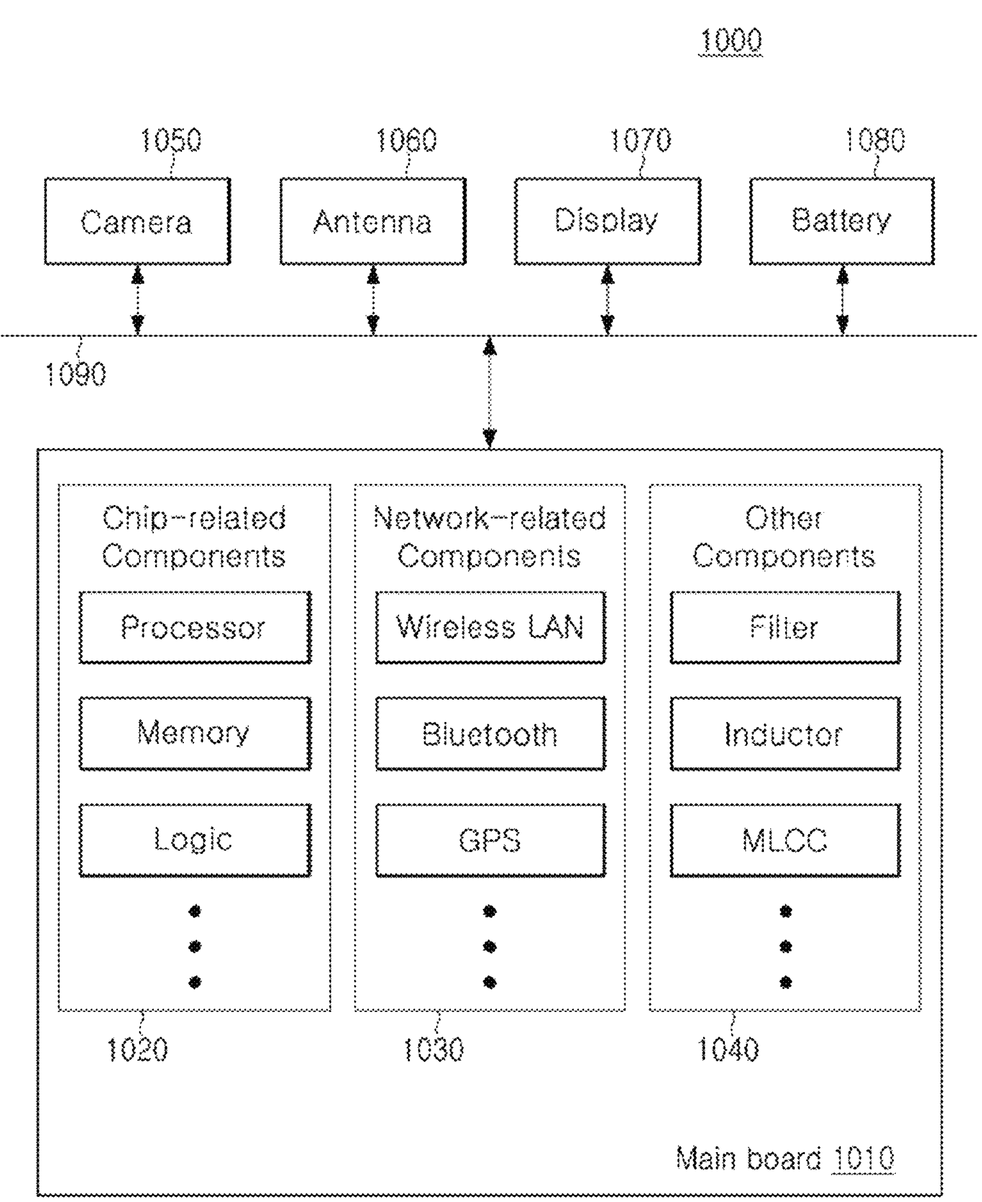
FIG. 1 is a schematic block diagram illustrating an example of an electronic device system.

Hereinafter, the present disclosure will be described with reference to the accompanying drawings. The shapes and sizes of components in the drawings may be exaggerated or reduced for clearer description.

Electronic Device

FIG. 1 is a schematic block diagram illustrating an example of an electronic device system.

Referring to FIG. 1, an electronic device 1000 may accommodate a mainboard 1010. The mainboard 1010 may include chip-related components 1020, network-related components 1030, and other components 1040, physically or electrically connected thereto. Such components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), or a flash memory, an application processor chip such as a central processor (for example, a central processing unit (CPU)), a graphics processor (for example, a graphics processing unit (GPU)), a digital signal processor, a cryptographic processor, a microprocessor, or a microcontroller, and a logic chip such as an m analog-to-digital converter or an application-specific integrated circuit (ASIC). However, the chip-related components 1020 are not limited thereto, and may include other types of chip-related components. In addition, the chip-related components 1020 may be combined with each other. The chip-related components 1020 may be in the form of a package including the above-described chip or electronic component.

The network-related components 1030 may include protocols such as wireless fidelity (Wi-Fi) (Institute of Electrical And Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the above-described protocols. However, the network-related components 1030 are not limited thereto, and may also include a variety of other wireless or wired standards or protocols. In addition, the network-related components 1030 may be combined with each other, together with the chip-related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, and may also include passive components used for various other purposes, or the like. In addition, the other components 1040 may be combined with each other, together with the chip-related components 1020 or the network-related components 1030 described above.

Depending on a type of the electronic device 1000, the electronic device 1000 may include other components that may be or may not be physically or electrically connected to the mainboard 1010. The other components may include, for example, a camera module 1050, an antenna module 1060, a display 1070, a battery 1080, and the like. However, the other components are limited thereto, and may be an audio codec, a video codec, a power amplifier, a compass, an accelerometer, a gyroscope, a speaker, a mass storage unit (for example, a hard disk drive), a compact disk (CD), a digital versatile disk (DVD), or the like. In addition, the other components may also include other components used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device to process data.

Figure 2:
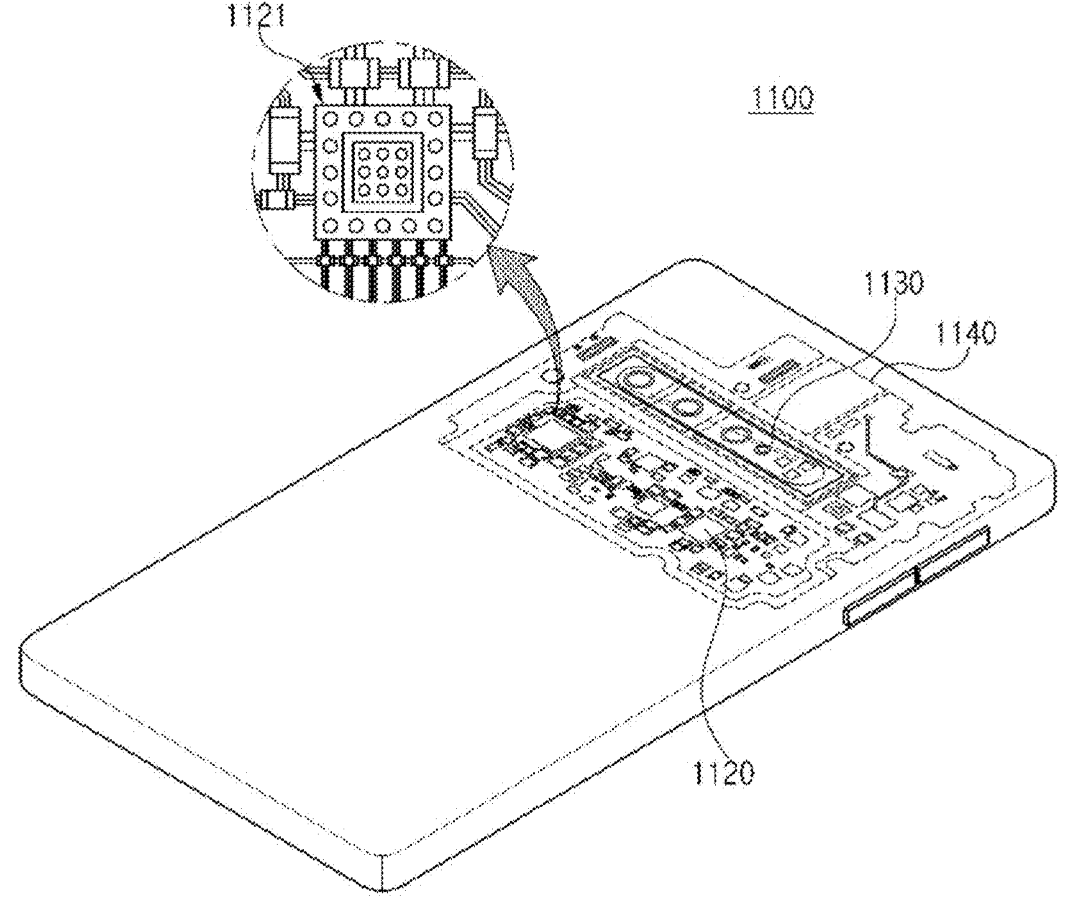
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. The motherboard 1110 may be accommodated in the smartphone 1100, and various electronic components 1120 may be physically and/or electrically connected to the motherboard 1110. In addition, other electronic components that may be or may not be physically and/or electrically connected to the motherboard 1110 may be accommodated therein, such as a camera module 1130 and/or a speaker 1140. A portion of the electronic components 1120 may be the chip-related components described above, for example, a component package 1121, but the present disclosure is not limited thereto. The component package 1121 may be in the form of a printed circuit board on which electronic components including active components and/or passive components are surface-mounted. The electronic device is not necessarily limited to the smartphone 1100, and may be other electronic devices, as described above.

Printed Circuit Board

Figure 3A:
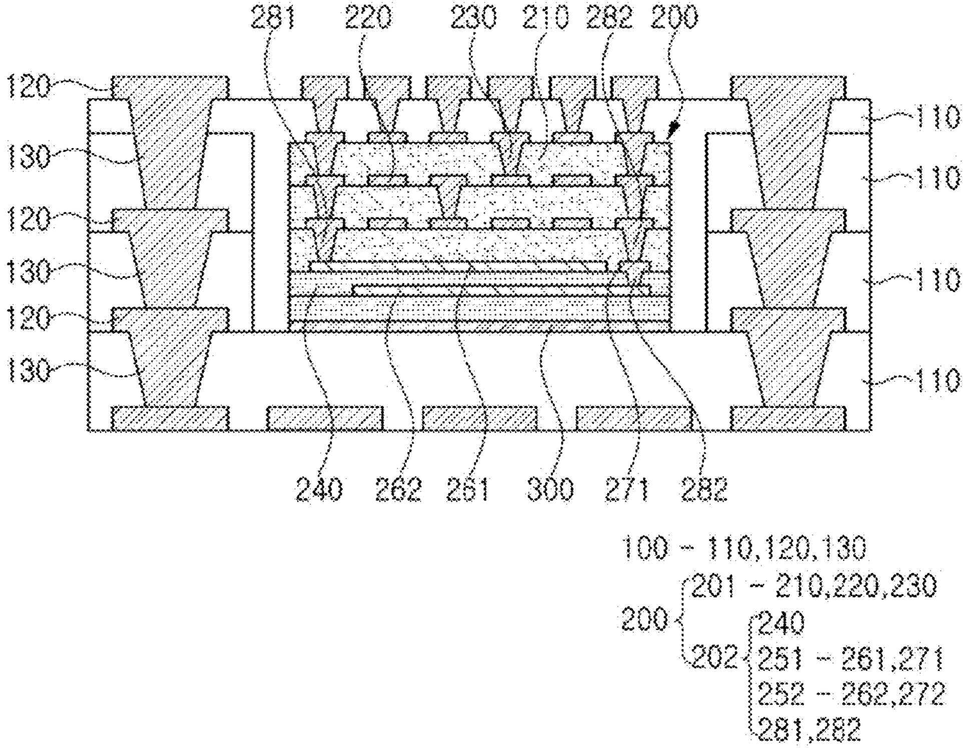
FIGS. 3A and 3B are schematic cross-sectional views illustrating a printed circuit board according to an example.
Figure 3B:
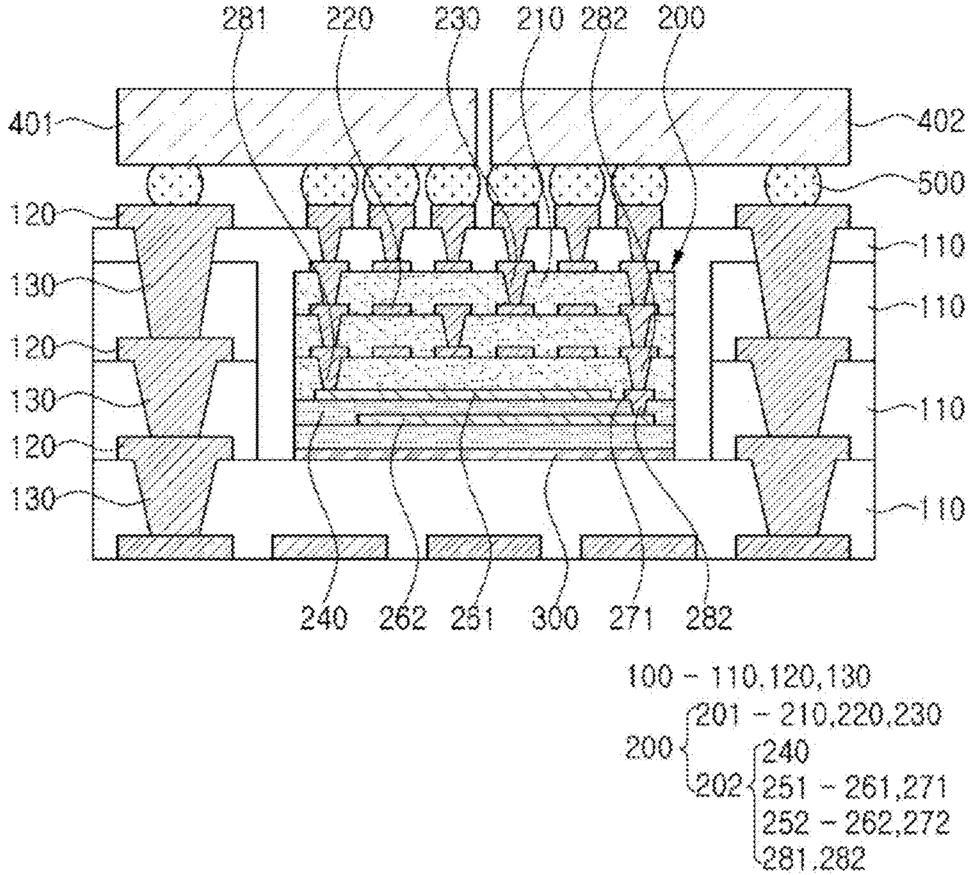

FIGS. 3A and 3B are schematic cross-sectional views illustrating a printed circuit board according to an example.

Referring to FIG. 3A, the printed circuit board according to an example may include a substrate portion 100 and a connection structure 200. The substrate portion 100 may be a portion implementing a signal path of the printed circuit board, and the connection structure 200 may be a portion connecting components such as a chip and the like to each other. The connection structure 200 may be a portion implementing a fine signal path in response to electronic components such as a fine chip and the like. Electronic components such as a plurality of chips may be disposed with the connection structure 200 interposed therebetween. The connection structure 200 may be a portion maintaining an electrical signal path by interconnecting the electronic components such as chips.

The substrate portion 100 may include a first insulating layer 110, a first wiring layer 120 disposed on or in the first insulating layer 110, and a cavity penetrating through at least a portion of the first insulating layer 110. The substrate portion 100 may include a first via layer 130 penetrating through at least a portion of the first insulating layer 110 to connect the first wiring layers 120 to each other.

The first insulating layer 110 may include a plurality of insulating layers, and each first insulating layer 110 may include an insulating material. The insulating material may include a thermosetting resin such as an epoxy resin, a thermoplastic resin such as polyimide, or a material including an inorganic filler, organic filler, and/or glass fiber (glass cloth, and/or glass fabric), together with such resins. The insulating material may be a photosensitive material and/or a non-photosensitive material. For example, the insulating material of the first insulating layer 110 may be prepreg (PPG), resin coated copper (RCC), or the like, but the present disclosure is not limited thereto, and may be an Ajinomoto build-up film (ABF), a photoimageable dielectric (PID), FR-4, bismaleimide triazine (BT), or the like. However, the present disclosure is not limited thereto. Other polymer materials having excellent rigidity may be used, as necessary.

The first wiring layer 120 may include a plurality of wiring layers, and each first wiring layer 120 may include a metal material. The metal material may include copper (Cu), aluminum (Al), silver (Ag), tin (Sn), gold (Au), nickel (Ni), lead (Pb), titanium (Ti), and/or alloys thereto. The first wiring layer 120 may include an electroless plating layer (or chemical copper) as a seed layer, and an electrolytic plating layer (or electrolytic copper) as a plating layer, but the present disclosure is not limited thereto. A sputtering layer may be formed instead of chemical copper as an electroless plating layer. Copper foil may be further included, as necessary. The first wiring layer 120 may perform various functions depending on the design of a corresponding layer. For example, a ground pattern, a power pattern, a signal pattern, and the like may be included. Here, the signal pattern may include various signals other than ground pattern, power pattern, and the like, for example, a data signal and the like. Such patterns may respectively include a line pattern, a plane pattern, and/or a pad pattern.

The first via layer 130 may include a plurality of via layers, and each first via layer 130 may include a micro via. The micro via may be a filled via filling a via hole, or a conformal via disposed along a wall surface of the via hole. The micro via may be disposed as a stacked-type via and/or a staggered-type via. Each first via layer 130 may include a metal material. The metal material may include copper (Cu), aluminum (Al), silver (Ag), tin (Sn), gold (Au), nickel (Ni), lead (Pb), titanium (Ti), or alloys thereof. A connection via layer may include an electroless plating layer (or chemical copper) as a seed layer, and an electrolytic plating layer (or electrical copper) as a plating layer, but the present disclosure is not limited thereto. A sputtering layer may be formed instead of chemical copper as an electroless plating layer. The first via layer 130 may perform various functions depending on the design of a corresponding layer. For example, a ground via, power via, signal via, and the like may be included. Here, the signal via may include various signals other than ground via, power via, and the like, for example, a via for transmitting a data signal and the like.

Each first wiring layer 120 and each first via layer 130 may be formed integrally with each other, but the present invention is not limited thereto. The first wiring layer 120 and/or the first via layer 130 may be formed using one of a semi-additive process (SAP), a modified semi-additive process (MSAP), tenting (TT), or a subtractive process, but the present disclosure is not limited thereto, and any method capable of forming a circuit in a printed circuit board may be used without limitation.

The first wiring layer 120 being disposed on or in the first insulating layer 110 may mean that the first wiring layer 120 may be disposed on or in the first insulating layer 110, or that the first wiring layer 120 may have a coreless-type board structure in which the first wiring layer 120 is buried in the first insulating layer 110. In particular, referring to FIG. 3, a lowermost first wiring layer 120 may be buried in the first wiring layer 110.

In FIGS. 3A and 3B, it is illustrated that the first insulating layer 110 includes four layers and a corresponding number of first wiring layers 120 and first via layers 130 are included, but the present disclosure is not limited thereto, and the number of the first insulating layers 110, first wiring layers 120, and first via layers 130 may be changed depending on the design thereof. In particular, the first insulating layer 110 may further include a core insulating layer including a core, the first wiring layer 120 may include copper foil, and the first via layer 130 may also include a through-via penetrating through the core insulating layer. Thus, the first insulating layer 110, the first wiring layer 120, and the first via layer 130 of the printed circuit board according to an example include a component that could be used by those skilled in the field of printed circuit board technology.

A cavity may penetrate through at least a portion of the first insulating layer 110. The cavity may correspond to a position in which the connection structure 200 is mounted. The cavity penetrating through at least a portion of the first insulating layer 110 may mean penetrating through an arbitrary continuous first insulating layer 110, among a plurality of first insulating layers 110, or penetrating through only a portion of an arbitrary first insulating layer 110, but the present disclosure is not limited thereto, and may mean penetrating through an arbitrary continuous first insulating layer 110 while penetrating through a portion of another arbitrary first insulating layer 110. Although not illustrated in FIGS. 3A and 3B, when the cavity penetrates through only a portion of an arbitrary first insulating layer 110, an upper surface of the first insulating layer 110 may have a step.

Any cavity forming method used for a known cavity forming process may be used without limitation. For example, a mechanical drilling process such as laser processing or a blasting process may be used, but the present disclosure is not limited thereto. In this case, a portion of the first wiring layer 120 disposed on the first insulating layer 110 may function as a stopper layer, and a stopper layer may be disposed on an upper surface of the first insulating layer 110, and may then be removed by etching or the like after cavity processing. When a stopper layer is formed, the stopper layer may be formed simultaneously with the first wiring layer 120. A wall surface of the cavity, penetrating through at least a portion of the first insulating layer 110, may be configured as a side surface of the first insulating layer 110, and a bottom surface of the cavity may be configured as an upper surface of the first insulating layer 110. Although not illustrated in FIGS. 3A and 3B, the bottom surface of the cavity may include a stopper layer.

The printed circuit board according to an example may include a connection structure 200. Referring to FIGS. 6A-8B which will be describe in detail later, the connection structure 200, disposed in the cavity, may include a wiring portion 201 and a capacitor portion 202.

The wiring portion 201 of the connection structure 200 may include a second insulating layer 210, a second wiring layer 220 disposed on or in the second insulating layer 210, and a second via layer 230 penetrating through at least a portion of the second insulating layer 210 to connect the second wiring layers 220 to each other.

The capacitor portion 202 of the connection structure 200 may include a plurality of first dielectric layers 240, and a first metal layer 251 and a second metal layer 252 disposed on or in the plurality of first dielectric layers 240. The first metal layer 251 may include a first metal plate 261 and a first connection pad 271 spaced apart from the first metal plate 261, and the second metal layer 252 may include a second metal plate 262 or include a second metal plate 262 and a second connection pad 272 spaced apart from the second metal plate 262. The capacitor portion 202 may include a first connection via 281 and a second connection via 282. The first connection via 281 may penetrate through at least a portion of the plurality of first dielectric layers 240 and/or at least a portion of the second insulating layer 210 to connect the second wiring layer 220 and the first metal plate 261 to each other. The second connection via 282 may penetrate through at least a portion of the plurality of first dielectric layers 240 and/or at least a portion of the second insulating layer 210 to connect the second wiring layer 220 and the second metal plate 262 to each other. The second connection via 282 may connect the second wiring layer 220 and the second metal plate 262 to each other through the first connection pad 271.

The wiring portion 201 of the connection structure 200 may have a wire density higher than that of the substrate portion 100. Higher wire density may be based on a relative concept, and may mean, for example, that an average pitch of a wire included in the second wiring layer 220 may be lower than an average pitch of a wire included in the first wiring layer 120. A pitch may be measured by photographing a cut cross-section of the printed circuit board using a scanning microscope, and an average pitch may be an average of values of the pitch between wires, measured at any five points. In addition, an average interlayer insulation distance between the second wiring layers 220 may be less than an average interlayer insulation distance between the plurality of first wiring layers 120. The interlayer insulation distance may also be measured by photographing a cut cross-section of the printed circuit board using a scanning microscope, and the average interlayer insulation distance may be an average of values of an insulation distance between adjacent wiring layers, measured at any five points. That is, the wire included in the second wiring layer 220 may be a high-density fine wire having a line/space (L/S) smaller than that of the wire included in the first wiring layer 120. As a non-limiting example, the line/space of the wire included in the second wiring layer 220 may be about 2/2 μm, but the present disclosure is not limited thereto. As the wiring portion 201 of the connection structure 200 has a density higher than that of a wire of the substrate portion 100, it may be effective when interconnecting electronic components such as semiconductor chips. That is, it may be effective for die-to-die interconnection.

In this regard, a thickness of the second insulating layer 210 may be less than a thickness of the first insulating layer 110, and a thickness of the second wiring layer 220 may be less than a thickness of the first wiring layer 120. A thickness of an insulating layer may be based on a concept including being approximate, and may mean a vertical distance between upper and lower surfaces of the insulating layer. A thickness of the second insulating layer 210 less than a thickness of the first insulating layer 110 may mean that a thickness of one second insulating layer 210, among a plurality of second insulating layers 210, is less than a thickness of one first insulating layer 110, among a plurality of first insulating layers 110, but the present disclosure is not limited thereto. The thickness of the first insulating layer 110 and the thickness of the second insulating layer 210 may be measured by photographing a cut cross-section of the printed circuit board using a scanning microscope, and may be an average of values of a thickness of the insulating layer, measured at any five points. A thickness of a wiring layer may be interpreted in the same sense as the thickness of the insulating layer.

Specific details regarding other components of the connection structure will be described below.

The printed circuit board according to an example may further include an adhesive layer 300.

The connection structure 200 may be disposed in the cavity of the substrate portion 100, and the connection structure 200 may be attached to a bottom surface of the cavity through the adhesive layer 300. The adhesive layer 300 may be disposed to cover a lower surface of the connection structure 200. As the adhesive layer 300, an adhesive film such as a general die attach film (DAF) may be used, but the present disclosure is not limited thereto, and any means capable of attaching a component such as an electronic component or a connection structure to the printed circuit may be used without limitation, such as a known tape or the like.

Referring to FIG. 3B, the printed circuit board according to an example may include a first semiconductor chip 401 disposed on a portion of the substrate portion 100 and a portion of the connection structure 200, and a second semiconductor chip 402 disposed on a portion of the substrate portion 100 and a portion of the connection structure 200, and may include a connection member 500 respectively connecting the first semiconductor chip 401 and the second semiconductor chip 402 to the substrate portion 100 and the connection structure 200. The first semiconductor chip 401 may be disposed to be electrically connected to a portion of the substrate portion 100 and a portion of the connection structure 200, and the second semiconductor chip 402 may be electrically connected to a portion of the substrate portion 100 and a portion of the connection structure 200 to be electrically connected to the first semiconductor chip 401 through the connection structure 200.

The first semiconductor chip 401 and the second semiconductor chip 402 may respectively include an integrated circuit (IC) die in which hundreds to millions of devices are integrated into a single chip. In this case, the IC may be, for example, a logic chip such as a central processor (for example, a CPU), a graphics processor (for example, a GPU), a field programmable gate array (FPGA), a digital signal processor, a cryptographic processor, a microprocessor, a microcontroller, an application processor (for example, an AP), an analog-to-digital converter, or an application-specific IC (ASIC), but the present disclosure is not limited thereto, and may also be a memory chip such as a volatile memory (for example, a DRAM), a non-volatile memory (for example, a ROM), a flash memory, or a high bandwidth memory (HBM), or a power management IC (PMIC). For example, the first semiconductor chip 401 may include a logic chip such as a GPU, and the second semiconductor chip 402 may include a memory chip such as an HBM. Alternatively, the first semiconductor chip 401 and the second semiconductor chip 402 may be logic chips divided by die split, the divided logic chips having different cores.

The first semiconductor chip 401 and the second semiconductor chip 402 may be respectively formed based on an active wafer. In this case, silicon (Si), germanium (Ge), gallium arsenide (GaAs), and the like may be used as base materials included in respective bodies. Various circuits may be formed in the body. A connection pad may be formed on each body, and the connection pad may include a conductive material such as aluminum (Al) or copper (Cu). The first semiconductor chip 401 and the second semiconductor chip 402 may be bare dies. In this case, a metal bump may be disposed on the connection pad. The first semiconductor chip 401 and the second semiconductor chip 402 may be packaged dies. In this case, a redistribution layer may be additionally formed on the connection pad, and a metal bump may be disposed on the redistribution layer.

The first semiconductor chip 401 and the second semiconductor chip 402 may be connected to the substrate portion 100 and the connection structure of the printed circuit board through the connection member 500. The connection member 500 may be formed of a low melting point metal, for example, solder such as tin (Sn)-aluminum (Al)-copper (Cu), but the present disclosure is not limited thereto. The connection member 500 may be formed as multiple layers or a single layer. When formed as multiple layers, the connection member 500 may include a copper pillar and solder. When formed as a single layer, the connection member 500 may include tin-silver solder or copper, but the present disclosure is not limited thereto. In addition, any means, serving as an intermediary to electrically connect a semiconductor chip or electronic component to the substrate portion 100 of the connection structure 200, may be used without limitation. In FIG. 3B, two semiconductor chips are illustrated as being mounted, but the present disclosure is not limited thereto. A larger number of semiconductor chips may be mounted, and a larger number of semiconductor chips may also be electrically connected to each other by the connection structure 200.

The printed circuit board according to an example is not limited to the components illustrated in FIGS. 3A and 3B, and may further include a general component of the printed circuit board. That is, the printed circuit board may further include a component that could be used by those skilled in the art.

Figure 4:
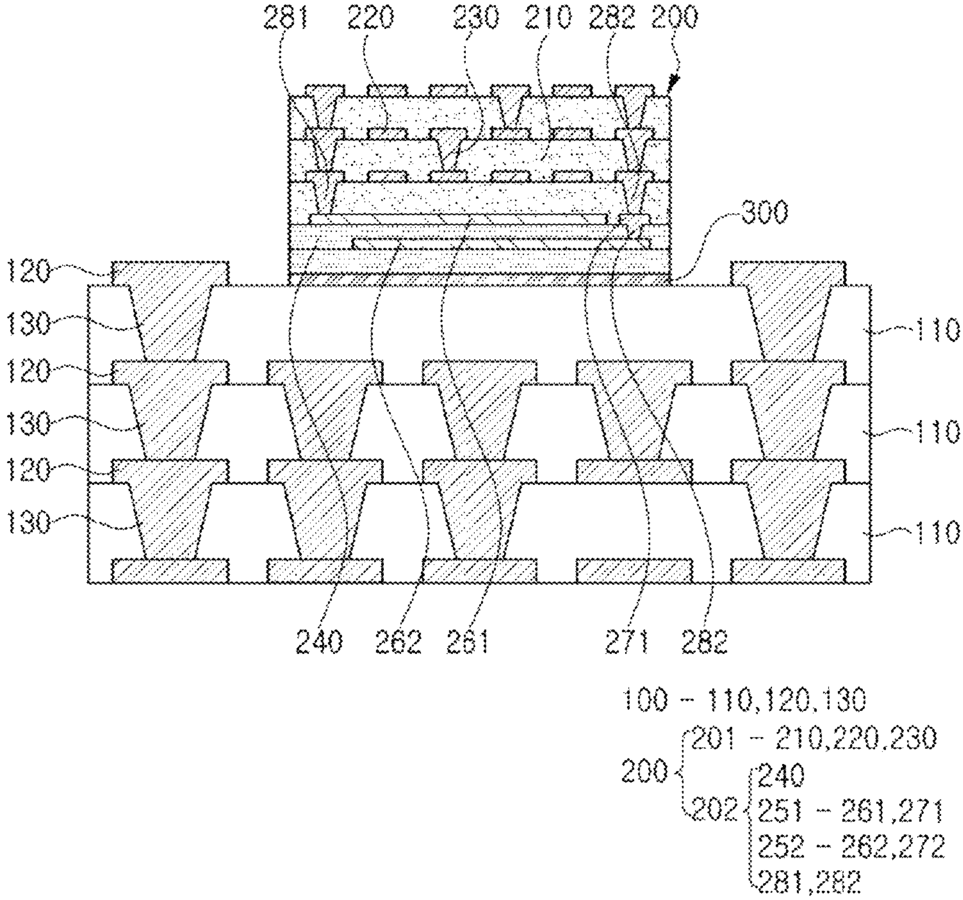
FIG. 4 is a schematic cross-sectional view illustrating a printed circuit board according to another example.

FIG. 4 is a schematic cross-sectional view illustrating a printed circuit board according to another example.

Referring to FIG. 4, a connection structure 200 of a printed circuit board according to another example may be disposed on a substrate portion 100. That is, the connection structure 200 may be disposed on a first insulating layer 110 of the substrate portion 100, and the first insulating layer 110 may not include a cavity.

A component the same as that of the printed circuit board according to an example, among components other than the connection structure 200, may be applied to the printed circuit board according to another example, and thus a repeated description related thereto will be omitted.

Figure 5:
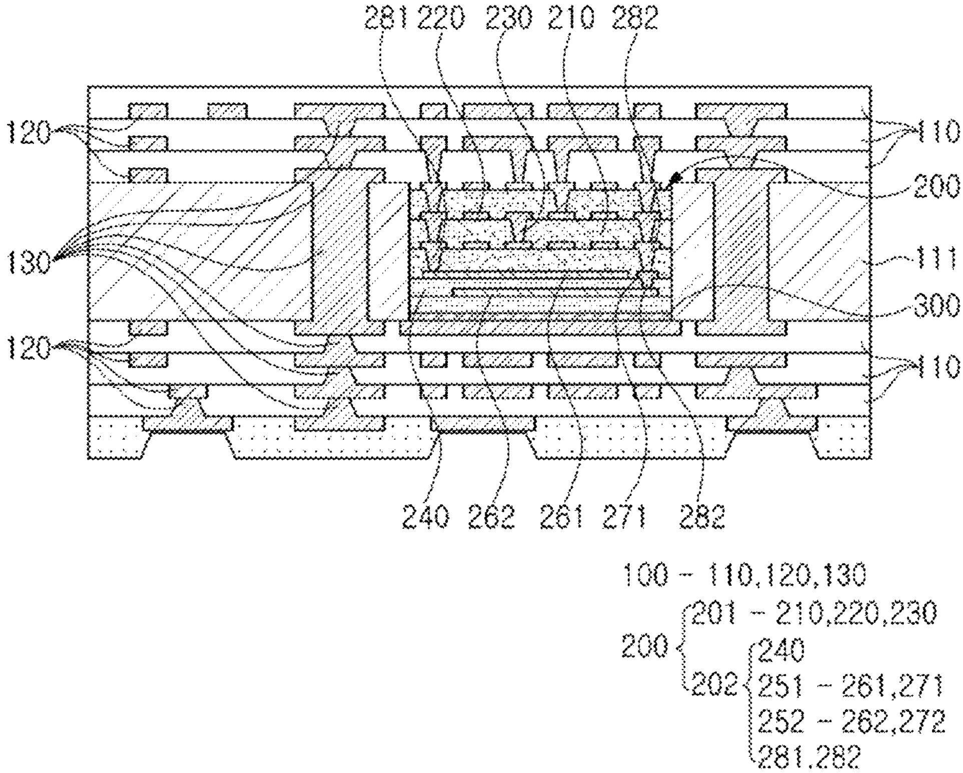
FIG. 5 is a schematic cross-sectional view illustrating a printed circuit board according to another example.

FIG. 5 is a schematic cross-sectional view illustrating a printed circuit board according to another example.

Referring to FIG. 5, a substrate portion 100 of the printed circuit board according to another example may include a core insulating layer 111, and a connection structure 200 may be mounted in a cavity formed in the core insulating layer 111. The core insulating layer 111 may include an insulating material. The insulating material may include a thermosetting resin such as an epoxy resin, a thermoplastic resin such as polyimide, or a resin in which the thermosetting resin or the thermoplastic resin is impregnated in a material mixed with an inorganic filler such as silica, or a core material such as a glass fiber (or glass cloth or glass fabric), together with the inorganic filler, for example, an insulating material copper clad laminate (CCL) or the like, but the present disclosure is not limited thereto. Here, a filler, for example, an insulating material such as copper clad laminate (CCL), may be used, but the present disclosure is not limited thereto. The core insulating layer 111 may be thicker than each of the first insulating layers 110, but the present disclosure is not limited thereto. In this case, on a lower surface of the cavity formed in the core insulating layer 111, a portion of the first wiring layer 120 may function as a stopper, but the present disclosure is not limited thereto.

A component the same as that of the printed circuit board according to an example, among components other than the core insulating layer 111 of the substrate portion 100 and the arrangement of the connection structure 200, may be applied to the printed circuit board according to another example, and thus a repeated description related thereto will be omitted.

Figure 6A:
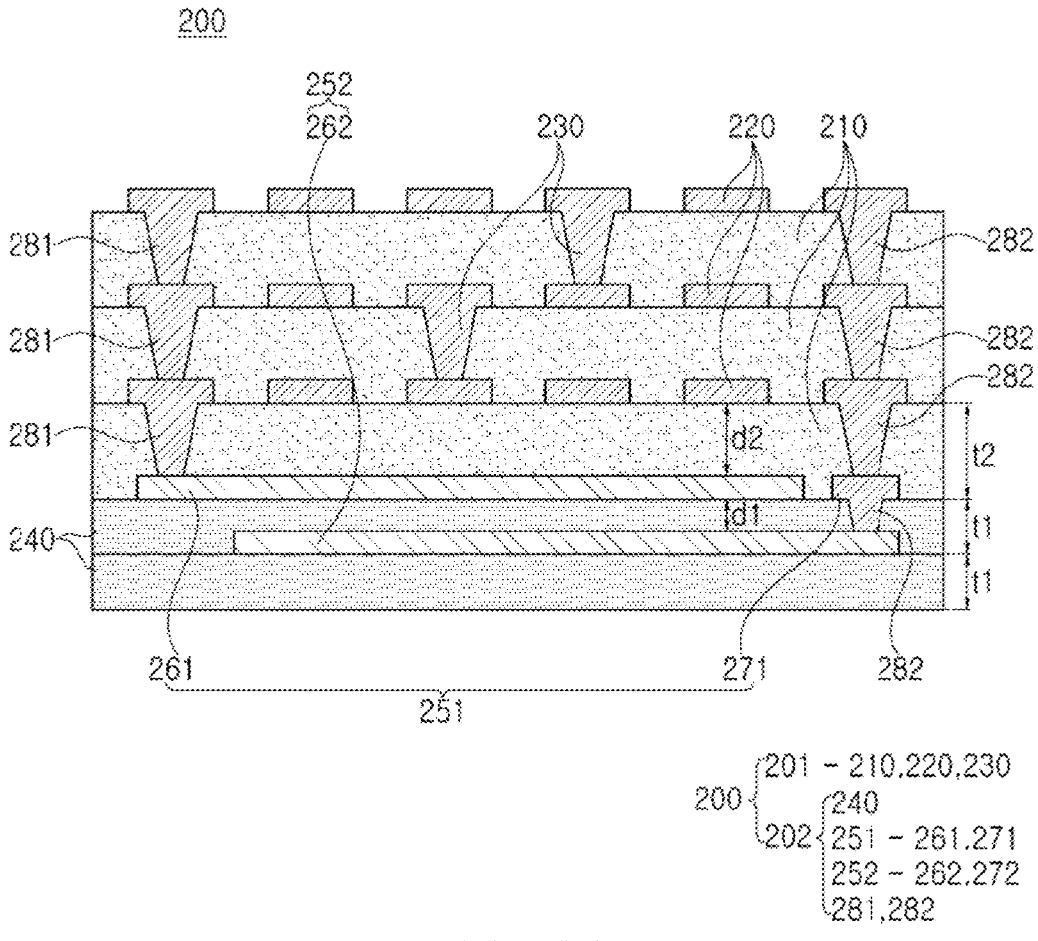
FIG. 6A is a schematic cross-sectional view illustrating a connection structure of a printed circuit board according to an example.
Figure 6B:
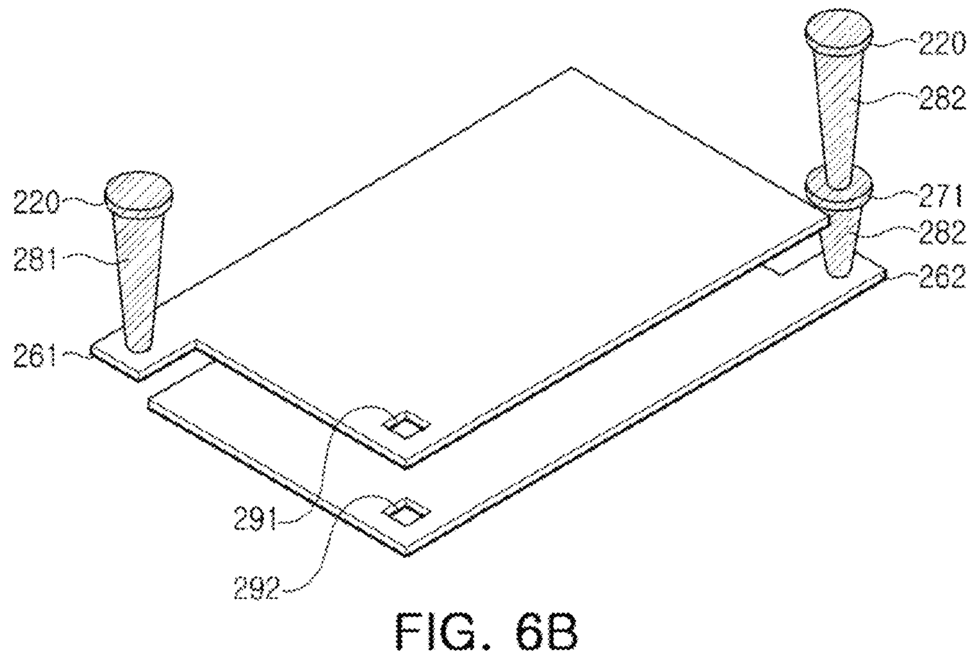
FIG. 6B is a schematic perspective view illustrating a capacitor portion of a connection structure of a printed circuit board according to an example.

FIG. 6A is a schematic cross-sectional view illustrating a connection structure of a printed circuit board according to an example. FIG. 6B is a schematic perspective view illustrating a capacitor portion of a connection structure of a printed circuit board according to an example.

Referring to FIG. 6A, a connection structure 200 may include a wiring portion 201 and a capacitor portion 202.

The wiring portion 201 of the connection structure 200 may include a second insulating layer 210, a second wiring layer 220 disposed on or in the second insulating layer 210, and a second via layer 230 penetrating through at least a portion of the second insulating layer 210 to connect the second wiring layers 220 to each other.

The second insulating layer 210 may include a plurality of insulating layers, and each second insulating layer 210 may include an insulating material. The insulating material may include a thermosetting resin such as an epoxy resin, a thermoplastic resin such as polyimide, or a material including an inorganic filler, organic filler, and/or glass fiber (glass cloth, and/or glass fabric), together with such resins. The insulating material may be a photosensitive material and/or a non-photosensitive material. For example, the insulating material of the second insulating layer 210 may be PPG, RCC, or the like, but the present disclosure is not limited thereto, and may be an ABF, PID, FR-4, BT, or the like. However, the present disclosure is not limited thereto. Other polymer materials having excellent rigidity may be used, as necessary. The second insulating layer 210 may include an insulating material formed of an organic material. That is, the connection structure 200 may be an organic bridge. Accordingly, even when the connection structure 200 is disposed on an upper side of the substrate portion 100, a reliability issue due to coefficient of thermal expansion (CTE) mismatch rarely occur, unlike in the case in which the connection structure 200 is a silicon bridge. In addition, when the connection structure 200 includes an organic insulating material, the difficulty and cost of a process for formation may be reduced. To form a fine circuit, a photosensitive insulating material (PID) may be used as the organic insulating material, but the present disclosure is not limited thereto.

The second wiring layer 220 may include a plurality of wiring layers, and each second wiring layer 220 may include a metal material. The metal material may include copper (Cu), aluminum (Al), silver (Ag), tin (Sn), gold (Au), nickel (Ni), lead (Pb), titanium (Ti), or alloys thereof. The second wiring layer 220 may include an electroless plating layer (or chemical copper) as a seed layer, and an electrolytic plating layer (or electrolytic copper) as a plating layer, but the present disclosure is not limited thereto. A sputtering layer may be formed instead of chemical copper as an electroless plating layer. Copper foil may be further included, as necessary. The second wiring layer 220 may perform various functions depending on the design of a corresponding layer. For example, a ground pattern, power pattern, signal pattern, or the like may be included. Here, the signal pattern may include various signals other than ground pattern, power pattern, and the like, for example, a data signal and the like. Such patterns may respectively include a line pattern, a plane pattern, and/or a pad pattern. An uppermost second wiring layer 220, among the second wiring layers 220, may be exposed from the second insulating layer 210, and may further include a surface treatment layer on the exposed surface.

The second via layer 230 may include a plurality of via layers, and each second via layer 230 may include a micro via. The micro via may be a filled via filling a via hole, or a conformal via disposed along a wall surface of the via hole. The micro via may be disposed as a stacked-type via and/or a staggered-type via. Each second via layer 230 may include a metal material. The metal material may include copper (Cu), aluminum (Al), silver (Ag), tin (Sn), gold (Au), nickel (Ni), lead (Pb), titanium (Ti), or alloys thereof. The second via layer 230 may include an electroless plating layer (or chemical copper) as a seed layer, and an electrolytic plating layer (or electrical copper) as a plating layer, but the present disclosure is not limited thereto. A sputtering layer may be formed instead of chemical copper as an electroless plating layer. The second via layer 230 may perform various functions depending on the design of a corresponding layer. For example, a ground via, power via, signal via, and the like may be included. Here, the signal via may include various signals other than ground via, power via, and the like, for example, a via for transmitting a data signal and the like.

Each second wiring layer 220 and each second via layer 230 may be formed integrally with each other, but the present invention is not limited thereto. The second wiring layer 220 and/or the second via layer 230 may be formed using one of an SAP, an MSAP, TT, or a subtractive process, but the present disclosure is not limited thereto, and any method capable of forming a circuit in a printed circuit board or a connection structure may be used without limitation.

In FIG. 6A, the second wiring layer 220 is illustrated as being disposed on the second insulating layer 210, but the present disclosure is not limited thereto, and the second wiring layer 220 may be disposed in the second insulating layer 210 to be buried in the second insulating layer 210. In this case, although not illustrated in FIG. 6A, the wiring portion 201 of the connection structure 200 may have a coreless-type wiring portion 201.

The capacitor portion 202 of the connection structure 200 may include a plurality of first dielectric layers 240, and a first metal layer 251 and a second metal layer 252 disposed on or in the plurality of first dielectric layers 240. The first metal layer 251 may include a first metal plate 261 and a first connection pad 271 spaced apart from the first metal plate 261, and the second metal layer 252 may include a second metal plate 262. The capacitor portion 202 may include a first connection via 281 and a second connection via 282. The first connection via 281 may penetrate through at least a portion of the plurality of first dielectric layers 240 and/or at least a portion of the second insulating layer 210 to connect the second wiring layer 220 and the first metal plate 261 to each other. The second connection via 282 may penetrate through at least a portion of the plurality of first dielectric layers 240 and/or at least a portion of the second insulating layer 210 to connect the second wiring layer 220 and the second metal plate 262 to each other. The second connection via 282 may connect the second wiring layer 220 and the second metal plate 262 to each other through the first connection pad 271.

The first dielectric layer 240 may include a dielectric material formed of an organic material. The dielectric material may include a thermosetting resin such as an epoxy resin, a thermoplastic resin such as polyimide, or a material including an inorganic filler, organic filler, and/or glass fiber (glass cloth, and/or glass fabric), together with such resins. The dielectric material may be a photosensitive material and/or a non-photosensitive material. For example, the dielectric material of the first dielectric layer 240 may be PPG, RCC, or the like, but may be an ABF, PID, FR-4, BT, or the like. However, the present disclosure is not limited thereto. Other polymer materials having excellent dielectric properties may be used, as necessary. In order to implement a fine circuit, to enable fine processing, and to form the thin first dielectric layer 240, a photosensitive dielectric material (PID), that is, a photosensitive resin, may be used as an organic insulating material, but the present disclosure is not limited thereto. Any material that may be disposed between the first metal layer 251 and the second metal layer 252, functioning as an electrode, to function as a dielectric may be used without limitation.

The first metal layer 251 and the second metal layer 252 may respectively include a metal material. The metal material may include copper (Cu), aluminum (Al), silver (Ag), tin (Sn), gold (Au), nickel (Ni), lead (Pb), titanium (Ti), or alloys thereof. The second wiring layer 220 may include an electroless plating layer (or chemical copper) as a seed layer, and an electrolytic plating layer (or electrolytic copper) as a plating layer, but the present disclosure is not limited thereto. A sputtering layer may be formed instead of chemical copper as an electroless plating layer. Copper foil may be further included, as necessary. The first metal layer 251 and the second metal layer 252 may be formed using one of an SAP, an MSAP, TT, or a subtractive process, but the present disclosure is not limited thereto. Any method of forming a metal layer may be used. The method of forming a metal layer is not limited, such as printing a conductive paste including a metal material on a green sheet.

The first metal plate 261 and the second metal plate 262 of the first metal layer 251 and the second metal layer 252 may respectively function as an internal electrode of the capacitor portion 202. That is, the first metal layer 251 and the second metal layer 252 may be charged to have opposite polarities, and thus may have capacitance. The first metal plate 261 and the second metal plate 262 may be disposed to correspond to each other, such that the first metal plate 261 and the second metal plate 262 may form a pair of metal plates. The first metal plate 261 and the second metal plate 262 may be disposed to oppose each other with the first dielectric layer 240 interposed therebetween. As the first metal plate 261 and the second metal plate 262 are disposed as described above, each metal plate may be charged with electric charge to function as a capacitor. The first metal plate 261 and the second metal plate 262 may have a rectangular plate, that is, may be in the form of a plate, but the present disclosure is not necessarily limited thereto, and may have a polygonal shape or a circular shape. In addition, the metal plate may have a groove portion or may have a shape in which many patterns are densely packed. Thus, the first metal plate 261 and the second metal plate 262 may have various designs, such as various shapes, depending on the capacitance required for the design of the printed circuit board and the design of the connection structure 200.

The first connection pad 271 may be disposed to be spaced apart from the first metal plate 261, and may be disposed on a level the same as that of the first metal plate 261. The first connection pad 271 may serve as an intermediate disposed to connect the second wiring layer 220 and the second metal layer 252 to each other. That is, the first connection pad 271 may serve as an intermediate such that the second connection via 282 for electrical connection to the second metal plate 262, disposed on a lower portion of the first metal plate 261, does not penetrate through the plurality of first dielectric layers 240 at once. That is, as the first connection pad 271 is disposed on the first metal layer, it may be more advantageous in an operation of forming a through-hole for forming the second connection via 282. In this case, the first connection pad 271 may be spaced apart from the first metal plate 261, and thus the first metal plate 261 and the second metal plate 262 may not be directly connected to each other. When the second connection via, penetrating through the plurality of first dielectric layers 240 at once, is formable, the first connection pad 271 may not be disposed.

The first connection via 281 may penetrate through at least a portion of the plurality of first dielectric layers 240 and/or at least a portion of the second insulating layer 210 to connect the second wiring layer 220 and the first metal plate 261 to each other, and the second connection via 282 may penetrate through at least a portion of the plurality of first dielectric layers 240 and/or at least a portion of the second insulating layer 210 to connect the second wiring layer 220 and the second metal plate 262 to each other. The second connection via 282 may connect the second wiring layer 220 and the second metal plate 262 to each other through the first connection pad 271. The first connection via 281 and the second connection via 282 may respectively include a metal material. The metal material may include copper (Cu), aluminum (Al), silver (Ag), tin (Sn), gold (Au), nickel (Ni), lead (Pb), titanium (Ti), or alloys thereof. The second wiring layer 220 may include an electroless plating layer (or chemical copper) as a seed layer, and an electrolytic plating layer (or electrolytic copper) as a plating layer, but the present disclosure is not limited thereto. A sputtering layer may be formed instead of chemical copper as an electroless plating layer. Copper foil may be further included, as necessary. The first connection via 281 and the second connection via 282 may be formed using one of an SAP, an MSAP, TT, or a subtractive process, but the present disclosure is not limited thereto. Any method of forming a via may be used without limitation. The second connection via 282 and the first connection pad 271 may be formed integrally with each other, but the present disclosure is not limited thereto. According to one example, a via such as the first connection via 281 and the second connection via 282 disposed in the connection structure 200 and connected to the second wiring layer 220 may be tapered in a direction from the second insulating layer 210 to the first dielectric layer 240, and a via 130 disposed in the substrate portion 100 and connected to the first wiring layer 120 may be tapered in a direction the same as the tapered direction of the via disposed in the connection structure 200.

A distance d1 between the first metal layer 251 and the second metal layer 252 may be less than a distance d2 between the first metal layer 251 and the second wiring layer 220. The distance d1 between the first metal layer 251 and the second metal layer 252 may be understood to mean a distance between an upper surface of the first metal layer 251 and a lower surface between the second metal layer 252. More specifically, the distance d1 may mean an insulation distance between the first metal layer 251 and the second metal layer 252. The distance d1 between the first metal layer 251 and the second metal layer 252 may be measured by photographing a cut cross-section of the printed circuit board or connection structure using a scanning microscope, and may be an average of values of the distance d1 between the first metal layer 251 and the second metal layer 252, measured at any five points. The distance d2 between the first metal layer 251 and the second wiring layer 220 may also be interpreted in the same manner. The distance d2 between the first metal layer 251 and the second wiring layer 220 may mean a distance between the first metal layer 251 and the second wiring layer 220, closest to the first metal layer 251.

As the distance d1 between the first metal layer 251 and the second metal layer 252 gradually decreases, the first metal plate 261 of the first metal layer 251 and the second metal plate 262 of the second metal layer 252 may serve as an electrode of a capacitor. The distance d1 between the first metal layer 251 and the second metal layer 252 may be 1 μm or less. When the distance d1 between the first metal layer 251 and the second metal layer 252 further decreases, the distance d1 may also be set to have a value of 0.33 μm or less. However, the distance d1 between the first metal layer 251 and the second metal layer 252 may be freely designed depending on the capacitance required for the capacitor portion 202 of the connection structure 200. In order to secure capacitance, the first metal layer 251 and the second metal layer 252 may need to be disposed to be close to each other such that the distance d1 therebetween has a value less than a predetermined value. However, the distance d1 between the first metal layer 251 and the second metal layer 252 may also have a value greater than 0. This may be because, when the first metal layer 251 and the second metal layer 252 come into contact with each other, a short circuit occurs, and capacitance is not obtainable accordingly.

In a similar sense that the distance d1 between the first metal layer 251 and the second metal layer 252 is less than the distance d2 between the first metal layer 251 and the second wiring layer 220, a thickness of the first dielectric layer 240 may be formed to be less than a thickness of the second insulating layer 210. The thickness of the first dielectric layer 240 that may be formed to be less than the thickness of the second insulating layer 210 may mean that a thickness of one first dielectric layer 240, among the plurality of first dielectric layers 240, may be formed to be less than a thickness of one second insulating layer 210, among the plurality of second insulating layers 210. The thickness of the first dielectric layer 240 may be based on a concept including being approximate, and may mean a vertical distance between upper and lower surfaces of the first dielectric layer 240. The thickness of the first dielectric layer 240 may be measured by photographing a cut cross-section of the printed circuit board using a scanning microscope, and may be an average of values of a thickness of the dielectric layer, measured at any five points. The thickness of the second insulating layer 210 may be interpreted in the same sense as the thickness of the first dielectric layer 240, which may be understood in the same sense as described above with respect to measurement of the thickness of the first insulating layer 110.

In order to form the first dielectric layer 240 to be thinner than the second insulating layer 210, the first dielectric layer 240 may be formed by performing spin coating on an insulating material instead of laminating the insulating material formed as a film. When the first dielectric layer 240 is formed by performing spin coating, an insulation distance, the distance d1 between the first metal layer 251 and the second metal layer 252, may be formed to be shorter, and the insulation distance may be easily adjusted. However, a method or means of forming the first dielectric layer 240 is not limited thereto, and any method of forming an insulating material or dielectric in a printed circuit board may be used without limitation, and any method of easily adjusting a thickness and forming a small thickness may be used without limitation. For example, when an insulating film for use in the first dielectric layer 240 is formed to have a small thickness, the insulating film may be formed using a lamination method.

The first dielectric layer 240 may include the same type of organic material as that of the second insulating layer 210. As described above, the first dielectric layer 240 may include a photosensitive insulating material (PID), that is, a photosensitive resin, to form a thin dielectric layer, and the second insulating layer 210 may include a photosensitive insulating material to implement a fine circuit. However, the materials of the first dielectric layer 240 and the second insulating layer 210 are not limited thereto, and may include various types of organic materials as described above. Even when the first dielectric layer 240 includes an organic material, the capacitor portion 202 may have capacitance by disposing the first metal layer 251 and the second metal layer 252 to be close to each other.

Referring to FIG. 6B, the capacitor portion 202 may include a pair of metal layers opposing each other. The first metal plate 261 of the first metal layer 251 and the second metal plate 262 of the second metal layer 252 may oppose each other, and capacitance may occur with respect to an effective area in which the first metal plate 261 and the second metal plate 262 oppose each other. Thus, the first metal plate 261 and the second metal plate 262 may be designed to increase the effective area. In FIG. 6B, it is illustrated that a protrusion is formed at both ends of a metal plate, and the protrusion is connected to the first connection via 281 or the second connection via 282. However, FIG. 6B illustrates an example of various designs of the first metal plate 261 and the second metal plate 262. A shape of the protrusion of the metal plate may be changed and a position of the first connection pad 271 may also be changed, as necessary.

Referring to FIG. 6B, the first metal plate 261 and the second metal plate 262 may respectively include a first hole 291 and a second hole 292 therein. The first hole 291 and the second hole 292 may correspond to degassing holes in the printed circuit board. The first hole 291 and the second hole 292 may be configured for degassing, and may be used as a path for ejection and removal of unnecessary moisture or gas generated in an operation of manufacturing the connection structure 200 and an operation of manufacturing the printed circuit board. In a general printed circuit board or another connection structure, degassing holes may be disposed in different positions of each layer to efficiently perform degassing. However, in the connection structure 200 of the printed circuit board according to an example, a position of the first hole 291, formed in the first metal plate 261, may correspond to a position of the second hole 292, formed in the second metal plate 262. That is, as the positions of the first hole 291 and the second hole 292 are formed to correspond to each other, an effective area of a region in which the first metal plate 261 and the second metal plate 262 overlap each other may be more easily adjusted. As the effective area between the first metal plate 261 and the second metal plate 262 is easily adjusted, the capacitor portion 202 may be easily designed to have necessary capacitance. In FIG. 6B, it is illustrated that one first hole 291 and one second hole 292 are formed, but the size, number, shape, and location of the first hole 291 and the second hole 292 are not limited, and may be changed depending on the design.

Although not illustrated in FIGS. 6A and 6B, the connection structure 200 may have a buried pattern structure. For example, an upper surface of an uppermost second wiring layer 220 may be buried in an upper surface of an uppermost second insulating layer 210, and thus may be exposed to the upper surface of the second insulating layer 210. When the connection structure 200 is formed to have such a structure, a wire may be designed with a finer pitch. In addition, as compared to a silicon bridge, costs required for manufacturing may be further reduced, and a process may be further simplified.

Figure 7A:
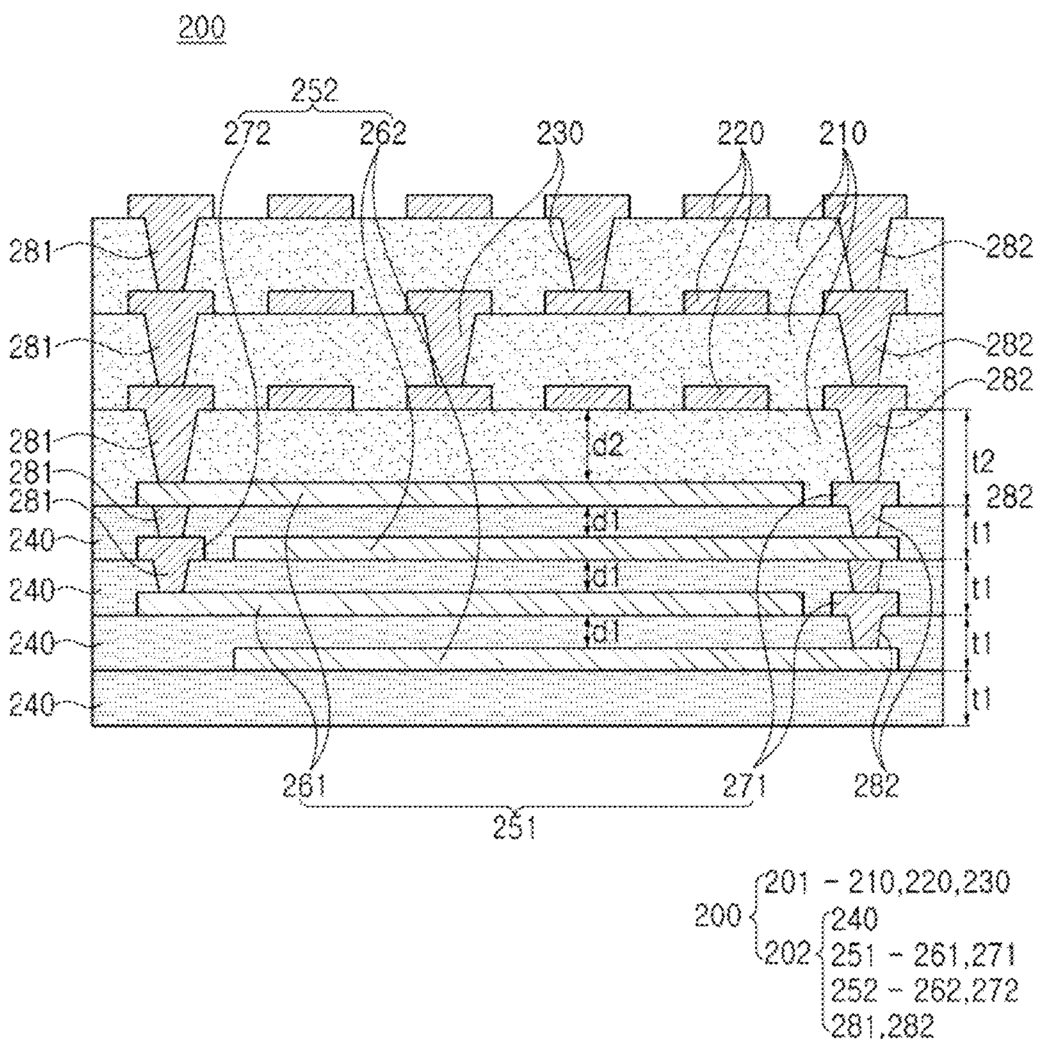
FIG. 7A is a schematic cross-sectional view illustrating a connection structure according to another example.
Figure 7B:
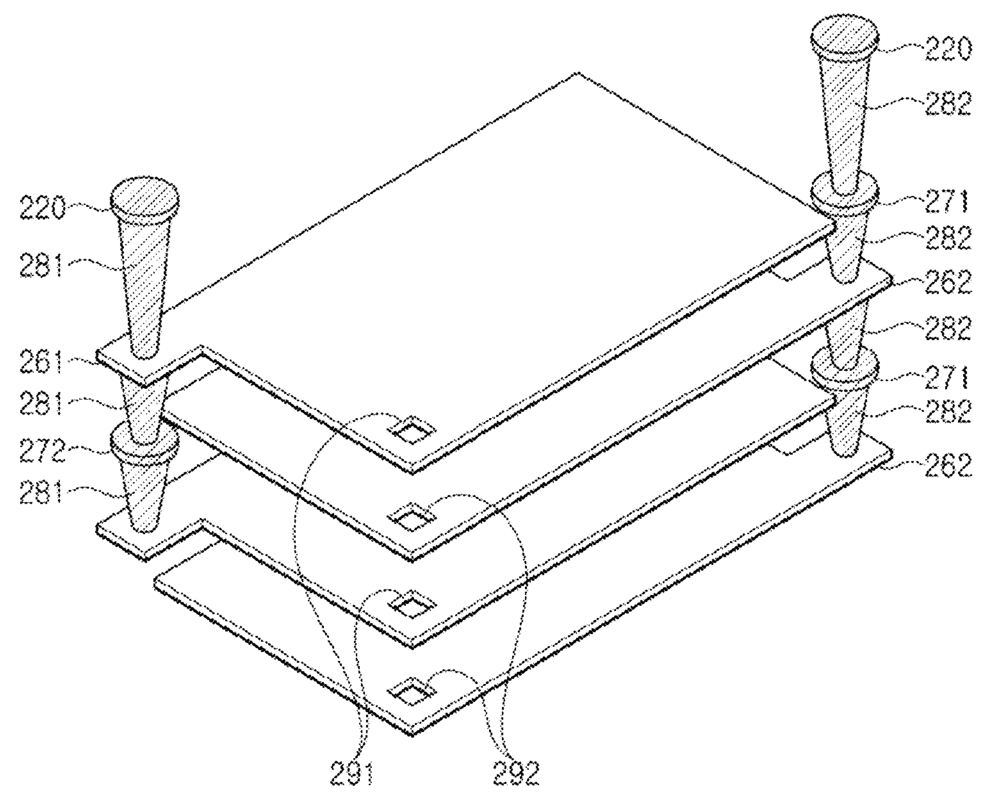
FIG. 7B is a schematic perspective view illustrating a capacitor portion of a connection structure according to another example.

FIG. 7A is a schematic cross-sectional view illustrating a connection structure according to another example. FIG. 7B is a schematic perspective view illustrating a capacitor portion of a connection structure according to another example.

Referring to FIGS. 7A and 7B, the connection structure according to another example may include a plurality of first metal layers 251 and a plurality of second metal layers 252. The first metal layer 251 and the second metal layer 252 may be alternately disposed with a first dielectric layer 240 interposed therebetween. That is, the second metal layer may be disposed between the first metal layers 251, and the first metal layer 251 may be disposed between the second metal layers 252.

The first metal layer 251 may include a first metal plate 261 and a first connection pad 271 spaced apart from the first metal plate 261, and the second metal layer 252 may include a second metal plate 262 and a second connection pad 272 spaced apart from the second metal plate 262. A first connection via 281 may connect a second wiring layer 220 and the first metal plate 261 to each other, and may also connect the second wiring layer 220 to another first metal plate 261 through the second connection pad 272. The second connection via 282 may connect the second wiring layer 220 and the second metal plate 262 to each other, and may also connect the second wiring layer 220 to another second metal plate 262 through the first connection pad 271. The second connection pad 272 may be disposed to be spaced apart from the second metal plate 262, and may have properties the same as those of the first connection pad 271, and thus a repeated description will be omitted.

In FIGS. 7A and 7B, it is illustrated that the first metal layer 251 and the second metal layer 252 respectively include two metal layers, and thus include a total of four metal layers. However, the number of metal layers is not limited thereto, and a larger number of metal layers may be disposed. That is, the number of metal layers may be designed in various manners depending on the capacitance of a capacitor portion 202.

A component of the connection structure according to an example, among components other than the first metal layer 251 and the second metal layer 252, may be applied to the connection structure according to another example, and thus a repeated description related thereto will be omitted.

Figure 8A:
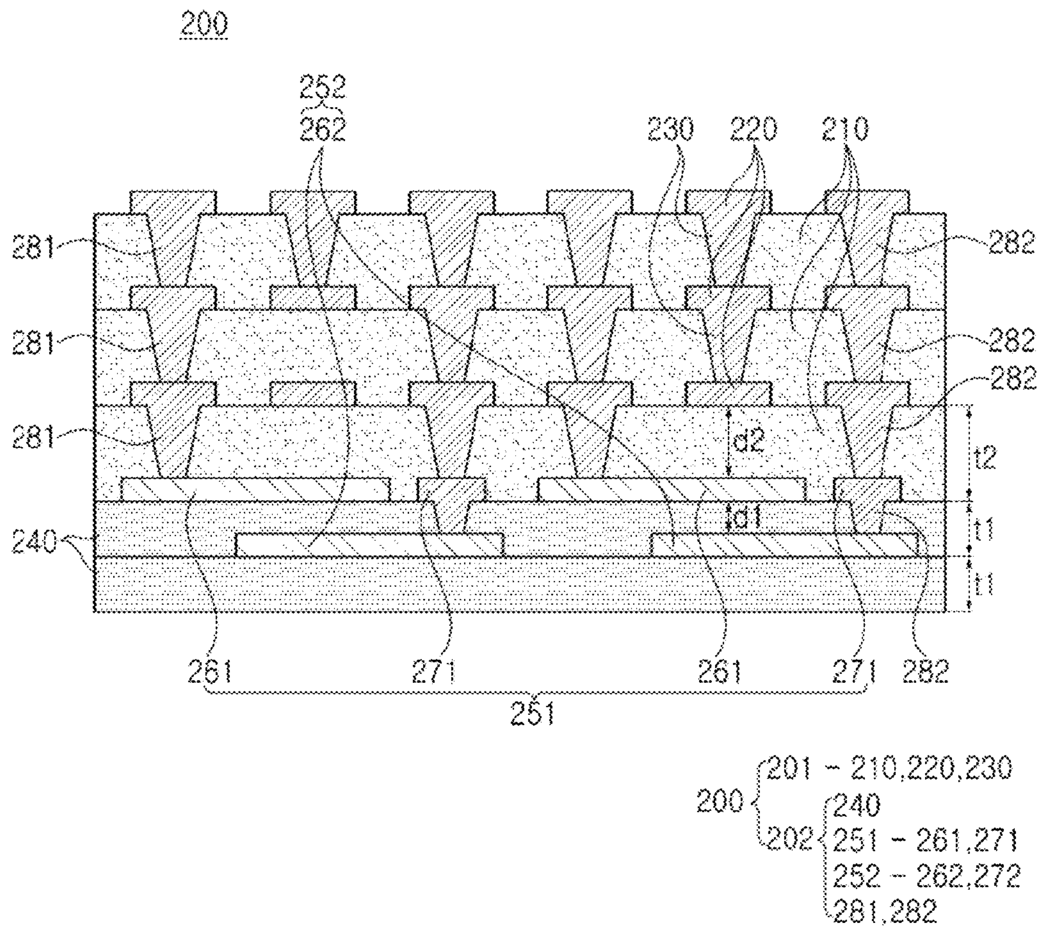
FIG. 8A is a schematic cross-sectional view illustrating a connection structure according to another example.
Figure 8B:
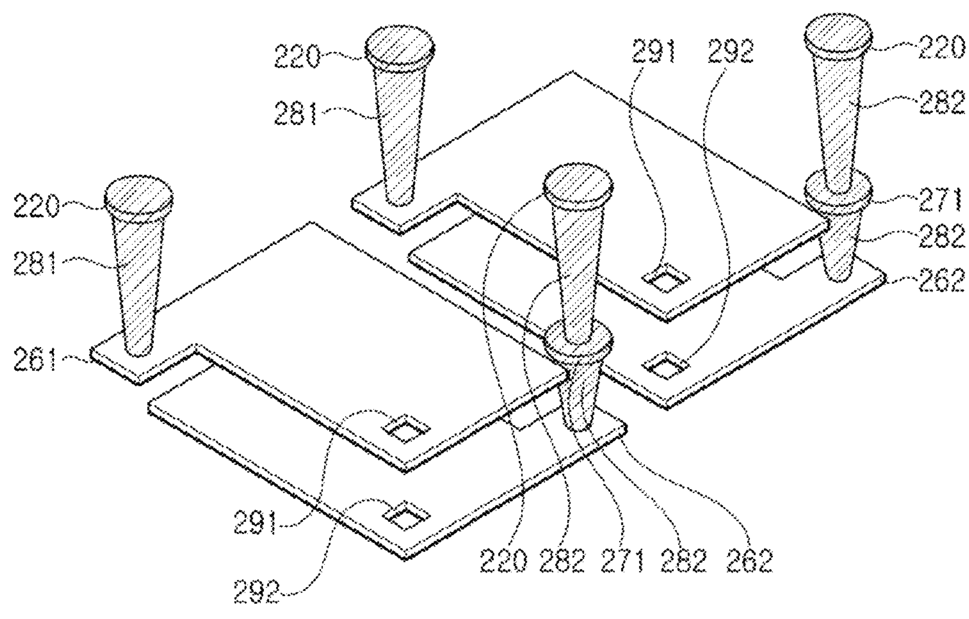
FIG. 8B is a schematic perspective view illustrating a capacitor portion of a connection structure according to another example.

FIG. 8A is a schematic cross-sectional view illustrating a connection structure according to another example. FIG. 8B is a schematic perspective view illustrating a capacitor portion of a connection structure according to another example.

Referring to FIGS. 8A and 8B, in the connection structure according to another example, one first metal layer 251 and one second metal layer 252 may include a plurality of first metal plates 261 and a plurality of second metal plates 262, respectively. In this case, respective first metal plates 261 may be disposed to be spaced apart from each other, and respective second metal plates 262 may be disposed to be spaced apart from each other. That is, in the connection structure 200 according to another example, a capacitor portion 202 may be disposed in parallel. Accordingly, the capacitor portion 202 may be designed in various manners to necessary capacitance.

In FIGS. 8A and 8B, it is illustrated that the first metal layer 251 and the second metal layer 252 respectively include two metal plates. However, the number of metal plates is not limited thereto, and a larger number of metal plates are disposed in parallel. It is illustrated that the first metal layer 251 and the second metal layer 252 is respectively configured as one metal layer. However, the first metal layer 251 and the second metal layer 252 may be respectively configured as a plurality of first metal layers 251 and a plurality of second metal layers 252. That is, the number of metal plates and the number of metal layers may be designed in various manners depending on the capacitance of the capacitor portion 202.

A component of the connection structure according to an example, among components other than the first metal plate 261 and the second metal plate 262, may be applied to the connection structure according to another example, and thus a repeated description related thereto will be omitted.

In the present disclosure, a cross-sectional shape may refer to a cross-sectional shape of an object when the object is vertically cut, or a cross-sectional shape of the object when the object is viewed in a side-view. In addition, a shape on a plane may be a shape of the object when the object is horizontally cut, or a planar shape of the object when the object is viewed in a top-view or a bottom-view.

In the present disclosure, an upper side, an upper portion, the upper surface, or the like is used to refer to a direction toward a surface on which an electronic component is mountable based on a cross-section of a drawing for ease, and a lower side, a lower portion, a lower surface, or the like is used to refer to an opposite direction thereof. However, the above-described directions are defined for ease of description. Thus, it should be understood that the scope of the claims is not particularly limited by the above-described directions.

As used herein, the term "connected" may not only refer to "directly connected" but also include "indirectly connected" by means of an adhesive layer, or the like. The term "electrically connected" may include both of a case in which components are "physically connected" and a case in which components are "not physically connected." In addition, the terms "first," "second," and the like may be used to distinguish a component from another component, and may not limit a sequence and/or an importance, or others, in relation to the components. In some cases, a first component may be referred to as a second component, and similarly, a second component may be referred to as a first component without departing from the scope of the example embodiments.

As used herein, the term "an example embodiment" is provided to emphasize a particular feature, structure, or characteristic, and do not necessarily refer to the same example embodiment. In addition, the particular characteristics or features may be combined in any suitable manner in one or more example embodiments. For example, a context described in a specific example embodiment may be used in other example embodiments, even if it is not described in the other example embodiments, unless it is described contrary to or inconsistent with the context in the other example embodiments.

The terms used herein describe particular example embodiments only, and the present disclosure is not limited thereby. As used herein, singular forms "a," "an," and "the" are intended to include the plural forms as well, unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A printed circuit board comprising:

a substrate portion including a first insulating layer, and a first wiring layer disposed on or in the first insulating layer; and a connection structure disposed on or in the substrate portion, and including a plurality of first dielectric layers, first and second metal layers respectively disposed on the plurality of first dielectric layers, a second insulating layer disposed on the plurality of first dielectric layers, and a second wiring layer disposed on the second insulating layer, wherein each of the plurality of first dielectric layers includes an organic material, a distance between the first metal layer and the second metal layer is less than a distance between the first metal layer and the second wiring layer, the first metal layer includes a first metal plate, and a first connection pad spaced apart from the first metal plate, and the second metal layer includes a second metal plate.

2. The printed circuit board of claim 1, wherein the connection structure includes a first connection via penetrating through at least a portion of the second insulating layer to connect the second wiring layer and the first metal plate to each other, and a second connection via penetrating through at least a portion of the plurality of first dielectric layers and at least a portion of the second insulating layer to connect the second wiring layer and the second metal plate to each other.

3. The printed circuit board of claim 2, wherein the second connection via connects the second wiring layer and the second metal plate to each other through the first connection pad.

4. The printed circuit board of claim 1, wherein the first metal layer and the second metal layer respectively include a plurality of first metal layers and a plurality of second metal layers, one of the plurality of second metal layers further includes a second connection pad spaced apart from the second metal plate of the one of the plurality of second metal layers, and the plurality of first metal layers and the plurality of second metal layers are alternately disposed with the first dielectric layer interposed therebetween.

5. The printed circuit board of claim 4, wherein the connection structure includes a first connection via penetrating through at least a portion of the plurality of first dielectric layers and at least a portion of the second insulating layer to connect the second wiring layer and the first metal plate to each other, and a second connection via penetrating through at least a portion of the plurality of first dielectric layers and at least a portion of the second insulating layer to connect the second wiring layer and the second metal plate to each other, the first connection via connects the second wiring layer and the first metal plate to each other through the second connection pad, and the second connection via connects the second wiring layer and the second metal plate to each other through the first connection pad.

6. The printed circuit board of claim 1, wherein each of an area of the first metal plate and an area of the second metal plate is greater than an area of the first connection pad.

7. The printed circuit board of claim 1, wherein the first metal layer includes a plurality of first metal plates spaced apart from each other, and a plurality of first connection pads spaced apart from the plurality of first metal plates, and the second metal layer includes a plurality of second metal plates spaced apart from each other.

8. The printed circuit board of claim 7, wherein the connection structure includes a first connection via penetrating through at least a portion of the second insulating layer to connect the second wiring layer and the first metal plate to each other, and a second connection via penetrating through at least a portion of the plurality of first dielectric layers and at least a portion of the second insulating layer to connect the second wiring layer and the second metal plate to each other, and the second connection via connects the second wiring layer and the plurality of second metal plates to each other through the plurality of first connection pads, respectively.

9. The printed circuit board of claim 1, wherein a thickness of the first dielectric layer is less than a thickness of the second insulating layer.

10. The printed circuit board of claim 1, wherein the first dielectric layer includes a photosensitive resin.

11. The printed circuit board of claim 1, wherein the first dielectric layer includes the same type of organic material as that of the second insulating layer.

12. The printed circuit board of claim 1, further comprising:

an adhesive layer disposed between the substrate portion and the connection structure.

13. The printed circuit board of claim 1, wherein a wire density of the first wiring layer is less than a wire density of the second wiring layer.

14. The printed circuit board of claim 1, wherein the first metal plate includes a first hole disposed therein, and the second metal plate includes a second hole, corresponding to the first hole therein.

15. The printed circuit board of claim 1, further comprising:

a first electronic component connected to a portion of the substrate portion and a portion of the connection structure; and a second electronic component connected to another portion of the substrate portion and another portion of the connection structure.

16. The printed circuit board of claim 1, wherein the second insulating layer is in contact with the first metal layer and the second wiring layer.

17. The printed circuit board of claim 1, wherein a via disposed in the connection structure and connected to the second wiring layer is tapered in a direction from the second insulating layer to the plurality of first dielectric layer, and a via disposed in the substrate portion and connected to the first wiring layer is tapered in a direction the same as the tapered direction of the via disposed in the connection structure.

18. A printed circuit board comprising:

a substrate portion including a first insulating layer, and a first wiring layer disposed on or in the first insulating layer; and a connection structure disposed on or in the substrate portion, the connection structure including a capacitor portion including a dielectric layer and a first metal layer disposed on or in the dielectric layer, and a wiring portion including a second insulating layer and a second wiring layer disposed on the second insulating layer, wherein the first metal layer includes a pair of metal plates, opposing each other, and the dielectric layer includes an organic material.

19. The printed circuit board of claim 18, wherein a wire density of the first wiring layer is less than a wire density of the second wiring layer.

* * * * *